United States Patent
Endo et al.

(10) Patent No.: US 9,490,108 B2
(45) Date of Patent: *Nov. 8, 2016

(54) INDIUM TARGET AND METHOD FOR MANUFACTURING SAME

(75) Inventors: Yousuke Endo, Kitaibaraki (JP); Takamasa Maekawa, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 116 days.

This patent is subject to a terminal disclaimer.

(21) Appl. No.: 13/704,086

(22) PCT Filed: May 20, 2011

(86) PCT No.: PCT/JP2011/061682
§ 371 (c)(1),
(2), (4) Date: Dec. 13, 2012

(87) PCT Pub. No.: WO2012/029363
PCT Pub. Date: Mar. 8, 2012

(65) Prior Publication Data
US 2013/0153414 A1 Jun. 20, 2013

(30) Foreign Application Priority Data
Sep. 1, 2010 (JP) ................................ 2010-196213

(51) Int. Cl.
*C23C 14/00* (2006.01)
*C25B 11/00* (2006.01)
(Continued)

(52) U.S. Cl.
CPC .............. *H01J 37/3426* (2013.01); *C22F 1/16* (2013.01); *C23C 14/14* (2013.01); *C23C 14/3414* (2013.01)

(58) Field of Classification Search
CPC .................................................. H01J 37/3426
USPC ....................................................... 204/298.13
See application file for complete search history.

(56) References Cited

U.S. PATENT DOCUMENTS 3,046,651 A    7/1962   Olmon et al.
4,124,474 A   11/1978   Bomchil et al.
(Continued)

FOREIGN PATENT DOCUMENTS

CN       102644053 A    8/2012
DE        10063383 C1    3/2002
(Continued)

OTHER PUBLICATIONS

International Search Report mailed Aug. 9, 2011 in co-pending PCT application No. PCT/JP2011/065585.
(Continued)

*Primary Examiner* — Ibrahime A Abraham
(74) *Attorney, Agent, or Firm* — Nields, Lemack & Frame, LLC

(57) ABSTRACT

Provided are an indium target capable of achieving a high deposition rate while suppressing the occurrence of arcing, and a method for manufacturing the indium target. In the process of solidification at the time of melting and casting an indium ingot, ultrasonic vibration is applied to molten indium liquid which is at least in a state immediately before solidification, and thereby, coarsening of the grain size is suppressed. Thus, an indium target is provided An indium target in which an overall average grain size is 10 mm or less; for the grains observed from a cross-section parallel to a thickness direction, a ratio of an average grain size in a direction parallel to the thickness direction with respect to an average grain size in a direction perpendicular to the thickness direction is 0.7 to 1.1; and pores with a pore size of 50 µm or greater exists at a density of 1 pore/cm$^3$ or less.

7 Claims, 1 Drawing Sheet

(51) Int. Cl.
- C25B 13/00 (2006.01)
- H01J 37/34 (2006.01)
- C23C 14/34 (2006.01)
- C23C 14/14 (2006.01)
- C22F 1/16 (2006.01)

(56) References Cited

U.S. PATENT DOCUMENTS

| | | | |
|---|---|---|---|
| 5,054,195 | A | 10/1991 | Keck et al. |
| 5,269,453 | A | 12/1993 | Melton et al. |
| 5,630,918 | A | 5/1997 | Takahara et al. |
| 6,030,514 | A | 2/2000 | Dunlop et al. |
| 6,309,556 | B1 | 10/2001 | Joyce et al. |
| 6,719,034 | B2* | 4/2004 | Heck et al. ............ 164/103 |
| 9,023,487 | B2 | 5/2015 | Endo et al. |
| 9,139,900 | B2 | 9/2015 | Endo et al. |
| 2003/0089482 | A1 | 5/2003 | Heck et al. |
| 2005/0029675 | A1 | 2/2005 | Hua |
| 2005/0269385 | A1 | 12/2005 | Chen et al. |
| 2005/0279630 | A1* | 12/2005 | Fonte ............ C23C 14/3414 204/298.21 |
| 2008/0271779 | A1* | 11/2008 | Miller et al. ............ 136/252 |
| 2008/0289958 | A1 | 11/2008 | Kardokus et al. |
| 2009/0057141 | A1 | 3/2009 | Tauchi et al. |
| 2009/0065354 | A1 | 3/2009 | Kardokus et al. |
| 2009/0250337 | A1 | 10/2009 | Simons et al. |
| 2009/0277777 | A1 | 11/2009 | Schultheis et al. |
| 2010/0099214 | A1 | 4/2010 | Buquing |
| 2010/0165585 | A1 | 7/2010 | Lin et al. |
| 2011/0067997 | A1 | 3/2011 | Nguyen et al. |
| 2011/0089030 | A1* | 4/2011 | Juliano et al. ............ 204/298.13 |
| 2011/0155560 | A1 | 6/2011 | Kuramochi et al. |
| 2012/0213917 | A1 | 8/2012 | Simons et al. |
| 2012/0273348 | A1 | 11/2012 | Endo et al. |
| 2013/0037408 | A1 | 2/2013 | Endo et al. |
| 2013/0105311 | A1 | 5/2013 | Maekawa et al. |
| 2013/0143069 | A1 | 6/2013 | Endo et al. |
| 2013/0270108 | A1 | 10/2013 | Endo et al. |
| 2015/0303039 | A1 | 10/2015 | Endo et al. |
| 2016/0126072 | A1 | 5/2016 | Endo |

FOREIGN PATENT DOCUMENTS

| | | |
|---|---|---|
| EP | 0500031 A1 | 8/1992 |
| EP | 2287356 A1 | 2/2011 |
| EP | 2612953 A1 | 7/2013 |
| JP | 57-185973 A | 11/1982 |
| JP | 58-145310 A | 8/1983 |
| JP | 63-111172 A | 5/1988 |
| JP | 63-44820 B | 9/1988 |
| JP | 3-99741 A | 4/1991 |
| JP | 4-301074 A | 10/1992 |
| JP | 5-214519 A | 8/1993 |
| JP | 6-287661 A | 10/1994 |
| JP | 8-60352 A | 3/1996 |
| JP | 8-218165 A | 8/1996 |
| JP | 8-281208 A | 10/1996 |
| JP | 9-25564 A | 1/1997 |
| JP | 10-280137 A | 10/1998 |
| JP | 11-236664 A | 8/1999 |
| JP | 2003-89869 A | 3/2003 |
| JP | 2003-136190 A | 5/2003 |
| JP | 2003-183820 A | 7/2003 |
| JP | 2003-533589 A | 11/2003 |
| JP | 2004-131747 A | 4/2004 |
| JP | 2005-2364 A | 1/2005 |
| JP | 2006-102807 A | 4/2006 |
| JP | 2006-322039 A | 11/2006 |
| JP | 2008-523251 A | 7/2008 |
| JP | 2009-242882 A | 10/2009 |
| JP | 2010-24474 A | 2/2010 |
| JP | 2011-236445 A | 11/2011 |
| JP | 4837785 B1 | 12/2011 |
| JP | 2012-052190 A | 3/2012 |
| JP | 2012-172265 A | 9/2012 |
| JP | 2012-251174 A | 12/2012 |
| TW | I310409 B | 6/2009 |
| WO | 01/73156 A2 | 10/2001 |
| WO | 2012/029364 A1 | 3/2012 |
| WO | 2012/108074 A1 | 8/2012 |
| WO | 2012/140928 A1 | 10/2012 |
| WO | 2014/030362 A1 | 2/2014 |

OTHER PUBLICATIONS

International Search Report mailed Aug. 9, 2011 in co-pending PCT application No. PCT/JP2011/065587.
Taiwanese Communication, with English translation, dated Aug. 27, 2012 in co-pending Taiwanese patent application No. 100127178.
International Search Report mailed Jun. 28, 2011 in corresponding PCT application No. PCT/JP2011/061682.
International Search Report mailed Aug. 28, 2012 in co-pending PCT application No. PCT/JP2012/068838.
International Search Report mailed Jun. 7, 2011 in co-pending PCT application No. PCT/JP2011/060969.
Alloy Digest, Indium Semi-Conductor Grade (data sheet), ASM International, Mar. 1998, 2 pages.
International Preliminary Report on Patentability mailed Oct. 31, 2013 in co-pending PCT application No. PCT/JP2011/065587.
European communication mailed Jan. 2, 2014 in corresponding European patent application No. 11821381.8.
Office Action mailed Oct. 18, 2013 in co-pending U.S. Appl. No. 13/504,329.
Office Action mailed Dec. 18, 2013 in co-pending U.S. Appl. No. 13/504,338.
Final Rejection mailed Feb. 12, 2014 in co-pending U.S. Appl. No. 13/808,009.
International Preliminary Report on Patentability mailed Mar. 14, 2013 in corresponding PCT application No. PCT/JP2011/061682.
English translation of International Search Report mailed Aug. 28, 2012 in co-pending PCT application No. PCT/JP2012/068838.
International Search Report/Written Opinion dated Sep. 11, 2012 in co-pending PCT application No. PCT/JP2012/070766.
Final Rejection mailed Apr. 9, 2014 in co-pending U.S. Appl. No. 13/504,329.
Final Rejection mailed Jun. 16, 2014 in co-pending U.S. Appl. No. 13/504,338.
English translation of International Preliminary Report on Patentability issued Mar. 25, 2014 in co-pending PCT application No. PCT/JP2012/068838.
Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
English translation of the Written Opinion mailed Aug. 9, 2011 in co-pending PCT application No. PCT/JP2011/065585.
English translation of the International Preliminary Report on Patentability transmitted Sep. 12, 2013 in co-pending PCT application No. PCT/JP2011/065585.
English translation of the International Search Report mailed Sep. 11, 2012 in co-pending PCT application No. PCT/JP2012/070766.
English translation of the Written Opinion transmitted Jun. 7, 2013 in co-pending PCT application No. PCT/JP2012/070766.
Office Action mailed Jul. 31, 2013 in co-pending U.S. Appl. No. 13/808,009.
Office Action—Restriction—mailed Sep. 27, 2013 in co-pending U.S. Appl. No. 13/504,338.
Office Action—Restriction—mailed May 23, 2013 in co-pending U.S. Appl. No. 13/808,009.
International Preliminary Report on Patentability mailed Feb. 28, 2013 in PCT application No. PCT/JP2011/060969.
Office Action mailed Feb. 26, 2015 in co-pending U.S. Appl. No. 13/504,329.
Notice of Allowance mailed Feb. 9, 2015 in co-pending U.S. Appl. No. 13/808,009.
Final Rejection mailed Jan. 28, 2015 in co-pending U.S. Appl. No. 13/809,296.

(56) References Cited

OTHER PUBLICATIONS

The Examiner's attention is drawn to co-pending U.S. Appl. No. 13/504,338, filed Apr. 26, 2012 by Endo, et al., and the Office Actions and references cited therein.
The Examiner's attention is drawn to co-pending U.S. Appl. No. 13/808,009, filed Jan. 2, 2013 by Endo, et al., and the Office Actions and references cited therein.
The Examiner's attention is drawn to co-pending U.S. Appl. No. 13/809,296, filed Jan. 9, 2013 by Maekawa, et al., and the Office Actions and references cited therein.
The Examiner's attention is drawn to co-pending U.S. Appl. No. 13/819,499, filed Feb. 27, 2013 by Endo, et al., and the Office Actions and references cited therein.
The Examiner's attention is drawn to co-pending U.S. Appl. No. 14/375,811, filed Jul. 31, 2014 by Endo, et al., and the Office Actions and references cited therein.
International Preliminary Report on Patentability mailed Mar. 5, 2015 in co-pending PCT application No. PCT/JP2013/052263.
Office Action—Restriction—mailed Apr. 23, 2015 in co-pending U.S. Appl. No. 13/819,499.
Office action mailed Aug. 27, 2015 in related U.S. Appl. No. 13/809,296.
Notice of Allowance mailed Jun. 23, 2015 in co-pending U.S. Appl. No. 13/504,329.
Final Rejection mailed May 4, 2015 in co-pending U.S. Appl. No. 13/809,296.
Office Action mailed Jul. 13, 2015 in co-pending U.S. Appl. No. 13/819,499.
Office Action mailed May 3, 2016 in co-pending U.S. Appl. No. 13/375,811.
International Preliminary Report on Patentability issued Jan. 14, 2016 in co-pending PCT application No. PCT/JP2014/058987.
Final rejection mailed Apr. 7, 2016 in co-pending U.S. Appl. No. 13/819,499.
European communication dated Dec. 23, 2015 in co-pending European patent application No. 13831560.1.
International Search Report mailed Jun. 24, 2014 in co-pending PCT application No. PCT/JP2014/058987.
Office Action mailed Nov. 18, 2015 in co-pending U.S. Appl. No. 13/819,499.
International Preliminary Report on Patentability mailed Jul. 17, 2014 in co-pending PCT application No. PCT/JP2012/070766.
International Search Report mailed May 7, 2013 in co-pending PCT application No. PCT/JP2013/052263.
Final Rejection mailed Sep. 26, 2014 in co-pending U.S. Appl. No. 13/504,329.
Final Rejection mailed Sep. 22, 2014 in co-pending U.S. Appl. No. 13/504,338.
Office Action mailed Sep. 17, 2014 in co-pending U.S. Appl. No. 13/808,009.
Office Action mailed Sep. 26, 2014 in co-pending U.S. Appl. No. 13/809,296.
Office Action mailed Aug. 24, 2016 in co-pending U.S. Appl. No. 13/819,499.

* cited by examiner

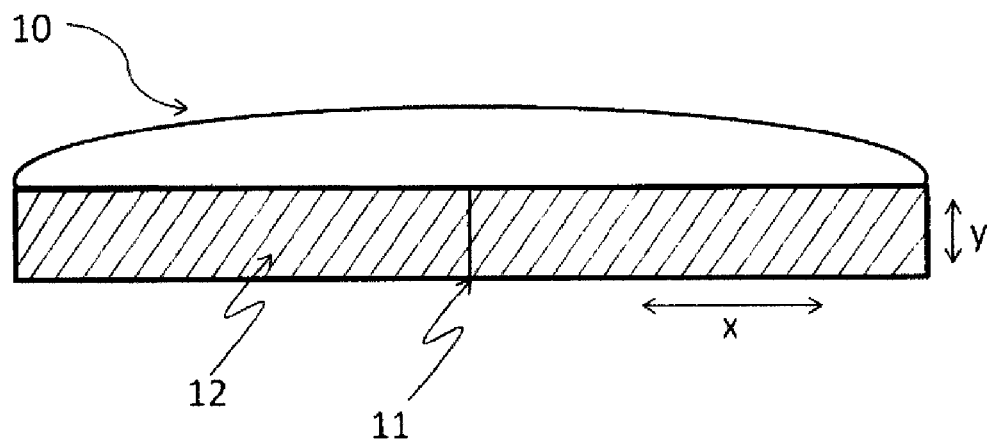

INDIUM TARGET AND METHOD FOR MANUFACTURING SAME

TECHNICAL FIELD

The present invention relates to a sputtering target and a method for manufacturing the same, and more particularly, to an indium target and a method for manufacturing the same.

BACKGROUND ART

Indium has been used as a sputtering target for forming a light absorbing layer for Cu—In—Ga—Se-based (CIGS-based) thin film solar cells.

Indium targets are conventionally manufactured mainly according to a melting and casting method.

Japanese Patent Application Publication No. 63-44820 (Patent Literature 1) describes a method of forming a thin film of indium on a backing plate, subsequently pouring indium on the thin film to cast indium, and thereby forming an indium target integrally with the backing plate.

Furthermore, Japanese Patent Application Laid-Open (JP-A) No. 2010-24474 (Patent Literature 2) describes a method of manufacturing an indium target including the steps of feeding a predetermined amount of an indium raw material into a heated mold for melting, removing indium oxide that floats on the surface, cooling the molten indium to obtain an ingot, and grinding the surface of the ingot to obtain an indium target, wherein the predetermined amount of the indium raw material is not fed to the mold all at once but is fed in several divided portions, indium oxide formed on the molten metal surface is removed each time, and then the ingot obtained by cooling the molten metal is surface ground.

CITATION LIST

Patent Literature

Patent Literature 1: Japanese Patent Application Publication No. 63-44820
Patent Literature 2: JP-A No. 2010-24474

SUMMARY OF INVENTION

Technical Problem

However, in the case of manufacturing an indium target by such a melting and casting method, if the cooling rate is high, there has been a problem that pores are produced in the interior of the target, and therefore, arcing eventually occurs during sputtering. On the other hand, if the cooling rate is decreased, there has been a problem that the grain size increases, and the deposition rate decreases.

Thus, an object of the present invention is to provide an indium target which is capable of achieving a high deposition rate while suppressing the occurrence of arcing, and a method for manufacturing the indium target.

Solution to Problem

The inventors of the present invention conducted a thorough investigation in order to solve the problems described above, and found that in a solidification process at the time of melting and casting of an indium ingot, when ultrasonic vibration is applied to molten indium liquid which is at least in a state immediately before solidification, the grain size of the indium ingot thus obtainable can be significantly reduced. It is not intended to have the present invention limited by theory, but it is speculated that this is because the ultrasonic vibration causes a large number of crystal nuclei to be formed at a high density, so that the gaps between grains are reduced, and coarsening of grain is suppressed.

As a result, even if the cooling rate at the time of melting and casting is decreased in order to prevent the generation of pores in the target, which is causative of arcing, since coarsening of grains is suppressed, a target having a high deposition rate is obtained.

According to an aspect of the present invention that has been accomplished based on the findings described above, there is provided An indium target wherein:
an overall average grain size is 10 mm or less;
for the grains observed from a cross-section parallel to a thickness direction, a ratio of an average grain size in a direction parallel to the thickness direction with respect to an average grain size in a direction perpendicular to the thickness direction is 0.7 to 1.1; and
pores with a pore size of 50 µm or greater exists at a density of 1 pore/cm$^3$ or less.

According to an embodiment of the present invention, the indium target has a maximum grain size of 20 mm or less.

According to another aspect of the present invention, there is provided a method for manufacturing an indium target, the method including a step of melting and casting an indium raw material, while ultrasonic vibration is applied at least at the time of solidification of the indium raw material.

According to an embodiment of the present invention, the method for manufacturing an indium target includes cooling at the time of melting and casting at a cooling rate of 3° C./min to 70° C./min.

Advantageous Effects of Invention

According to the present invention, an indium target is obtained, which is capable of maintaining a high deposition rate while suppressing the occurrence of arcing. Furthermore, in the present invention, since indium has no added impurities such as a grain refining agent, an effect of facilitating the recycling of targets is also obtained.

BRIEF DESCRIPTION OF DRAWING

FIG. 1 is a schematic diagram illustrating the direction perpendicular to the thickness direction, x, and the direction parallel to the thickness direction, y, employed when the cross-sectional aspect ratio is measured.

DESCRIPTION OF EMBODIMENT

The present invention is characterized in that in the solidification process at the time of melting and casting of an indium ingot, ultrasonic vibration is applied to molten indium liquid in a state immediately before solidification, and thereby, coarsening of the grain size is suppressed. According to the present invention, the overall average grain size of the indium target can be controlled to 10 mm or less. In general, when an indium ingot is produced by a melting and casting method, if it is intended to avoid the generation of pores in the indium ingot, it is necessary to perform cooling at a cooling rate that is slow to a certain extent. In this case, the average grain size increases to about 40 mm or greater. With such a large grain size, the deposition rate of the sputtering process is reduced. However, in the present invention, the growth of grains can be suppressed even at such a slow cooling rate, by applying ultrasonic vibration at the time of solidification. Furthermore, the application of ultrasonic vibration also has an effect of suppressing the amount of pores.

When the overall average grain size decreases, the deposition rate increases correspondingly. However, since there are limitations on the reduction of grains, the overall average grain size is preferably 1 mm to 6 mm, and more preferably 1 mm to 3 mm.

Furthermore, according to an embodiment of the present invention, since the indium target can be manufactured without carrying out cold rolling after the process of melting and casting, the indium target is also characterized in that the ratio of the average grain size in a direction parallel to the thickness direction with respect to the average grain size in a direction perpendicular to the thickness direction, in the grains observed from a cross-section that is parallel to the thickness direction (hereinafter, also referred to as "cross-sectional aspect ratio") is close to 1, that is, the grains are not flat. Specifically, the cross-sectional aspect ratio is 0.7 to 1.1, and typically 0.8 to 1.0.

According to the present invention, the overall average grain size of the indium target is measured by the following method. The surface of a target is lightly etched with a weak acid. Alternatively, carbon powder is applied to the surface to make the grain boundaries easily visible, subsequently an arbitrary area measuring 25 mm×50 mm on the target surface is defined as a region to be measured, and the number of grains (N) in the region is counted by visual inspection. A grain which exists over the boundary of the region is handled as 0.5 grains. The average area of the grains (s) is calculated by dividing the area of the region to be measured (S=1250 mm$^2$) by the number of grains (N). Assuming that the grains are spherical, the average grain size (A) is calculated by the following formula:

$$A=2(s/\pi)^{1/2}$$

According to the present invention, the cross-sectional aspect ratio is measured by the following method. With reference to FIG. 1, a target is cut in an arbitrary thickness direction such that the cut surface passes the central axis 11 of the target 10. Subsequently, the exposed cut surface 12 is lightly etched with a weak acid. Alternatively, carbon powder is applied on the cut surface 12 to make the grain boundaries easily visible, and then any twenty grains are designated as objects of measurement. The average grain size (a) in a direction x perpendicular to the thickness direction, and the average grain size (b) in a direction y parallel to the thickness direction are calculated by visual inspection, and thereby the cross-sectional aspect ratio (b/a) is determined.

The average grain size in a direction perpendicular to the thickness direction is the average value for the grains as the objects of measurement, provided that the longest line segment perpendicular to the thickness direction that can be circumscribed by each grain is designated as the grain size in the direction perpendicular to the thickness for each grain.

The average grain size in a direction parallel to the thickness direction is the average value for the grains as the objects of measurement, provided that the longest line segment parallel to the thickness direction that can be circumscribed by each grain is designated as the grain size in the direction parallel to the thickness for each grain.

According to a preferred embodiment of the present invention, the indium target has a maximum grain size of 20 mm or less. By controlling the maximum grain size to 20 mm or less in addition to the overall average grain size of the target, the fluctuation in the grain size distribution is decreased. Thereby, the change in the deposition rate of sputtering is reduced, and also, in particular, regions with slow deposition rates are eliminated. The maximum grain size is preferably 15 mm or less, and more preferably 10 mm or less, for example, 5 mm to 10 mm.

According to the present invention, the maximum grain size of the indium target is measured by the following method.

Based on the area of the largest grain (smax) among the grains in the area to be measured at the time of measuring the overall average grain size of the indium target as described above, the maximum grain size (B) is calculated by the following formula assuming that the grain is spherical:

$$B=2(smax/\pi)^{1/2}$$

According to a preferred embodiment of the present invention, the indium target has pores having a pore size of 50 μm or greater at a density of 1 pore/cm$^3$ or less. Pores that are present in the interior of the target, particularly, large pores having a pore size of 50 μm or greater, cause the occurrence of arcing during sputtering, and therefore, it is preferable to reduce the pores as much as possible. According to the present invention, since there is provided an effect of suppressing the coarsening of grains by ultrasonic vibration, cooling can be carried out at a slow cooling rate, which suppresses the generation of pores at the time of melting and casting of the ingot. Therefore, grain refinement and prevention of the generation of pores can be compatibly achieved. The density of pores having a pore size of 50 μm or greater is preferably 0.5 pores/cm$^3$ or less, and more preferably 0.3 pores/cm$^3$ or less, for example, 0 to 0.3 pores/cm$^3$.

According to the present invention, the number density of pores having a pore size of 50 μm or greater is measured with an electron scanning ultrasonic probe. A target is placed in the probe water bath of the apparatus, and measurement is made at a frequency range of 1.5=20 MHz, a pulse repetition frequency of 5 kHz, and a scan speed of 60 mm/min. Pores having a pore size of 50 μm or greater are counted from the image thus obtainable, and thereby, the number density of the pores is determined from the volume of the target to be measured. Here, the pore size is defined as the diameter of the smallest circle that circumscribes a pore in the image.

Next, a suitable example of the method for manufacturing an indium target according to the present invention will be described in order. First, the raw material indium is melted and poured into a mold. The raw material indium to be used desirably has high purity, for the reason that if impurities are included, the conversion efficiency of a solar cell manufactured from the raw material is decreased. For example, a raw material having a purity of 99.99% by mass or higher can be used. Subsequently, the raw material indium is cooled to room temperature, and thus an indium ingot is formed. From the viewpoint of accelerating the production of a large number of crystal nuclei at the time of initiation of crystallization, it is necessary to carryout the application of ultrasonic waves at least at the time of solidification of the indium raw material.

Specifically, it is preferable that the temperature be decreased slowly from the melting temperature of indium, and the application of ultrasonic waves be initiated at least when the temperature has decreased to a value immediately above the melting point of indium of 156° C. (for example, 157° C. to 160° C.) Ultrasonic vibration may also be applied at a time point where the temperature is still higher than this, that is, while indium is in a molten state, but it is somehow meaningless. It is important to apply ultrasonic vibration immediately before solidification. Furthermore, the application may be continued until the solidification of indium is completed, but this is also unnecessary, and the application of ultrasonic vibration may be stopped at a time point where, for example, the temperature of indium has decreased to about 159° C., and typically to about 157° C.

There are no particular limitations on the method of applying ultrasonic vibration, and any known method can be employed. However, for example, a method of applying ultrasonic vibration to a molten indium liquid immediately before solidification by using an apparatus based on the principle that an electrostriction type vibrator vibrates at a high frequency, amplifying the vibration of the vibrator with an amplifier, subsequently transferring the vibration to an ultrasonic vibration horn, and inserting this ultrasonic vibration horn directly into molten indium, is preferred because ultrasonic vibration can be directly applied to the interior of indium.

Cooling at the time of solidification may be achieved by natural cooling by air (about 10° C./min), but when the cooling rate is decreased, for example, to a rate of 9° C./min or less, and preferably to a rate of 8° C./min or less, an effect of further suppressing the generation of pores in the ingot may be obtained. However, if the cooling rate is too slow, the effect of suppressing the coarsening of crystals by ultrasonic vibration may not be sufficiently obtained in this case. Therefore, it is preferable to set the cooling rate to 3° C./min or higher, and it is more preferable to set the cooling rate to 5° C./min or higher. On the other hand, in the case of emphasizing the prevention of the growth of grain size, the cooling rate can also be increased. For example, the cooling rate can be set to 20° C./min or higher, and preferably to 50° C./min. However, if the cooling rate is too high, the amount of pores is likely to increase in this case, and therefore, it is preferable to perform cooling at a rate of 70° C./min even at the maximum. Particularly, since ultrasonic vibration is applied in the present invention, the rate of increase of the amount of pores is smaller than the rate of increase of the cooling rate. Accordingly, when the cooling rate is set to a slightly high value, a high deposition rate can be achieved, and a high level of suppression of arcing can be also achieved.

The adjustment of the cooling rate can be carried out, in the case of decreasing the cooling rate, by heating the mold and keeping it heated with a heater or the like; and in contrast, in the case of increasing the cooling rate, by a water cooling method or the like involving supplying cooling water to the periphery of the mold. The cooling rate here is calculated by the formula: (melting temperature of indium −25° C.)/(time taken until the temperature of indium decreases from the melting temperature to 25° C. after the initiation of cooling). After the process of melting and casting, the indium ingot is subjected to a shape processing or surface polishing as necessary, and thereby an indium target is obtained.

The thickness of the target is not particularly limited, and may be appropriately set in accordance with the sputtering apparatus to be used, the time of use in film formation, or the like. However, the thickness is usually about 3 mm to 20 mm, and typically about 5 mm to 10 mm.

An indium target thus obtained can be suitably used as a sputtering target for the manufacture of light absorbing layers for CIGS-based thin film solar cells.

EXAMPLES

Hereinafter, Examples of the present invention will be disclosed together with Comparative Examples, but these Examples are provided only for the purpose of making the present invention and advantages thereof more understandable, and are not intended to limit the invention by any means.

An indium raw material (purity: 5 N) was melted at 170° C., and this molten body was poured into a cylindrical mold having a diameter of 250 mm and a height of 7 mm. The indium raw material was cooled to room temperature (25° C.) at the cooling rate indicated in Table 1, and thus an indium ingot was manufactured. At this time, in the Invention Examples, application of ultrasonic vibration was initiated at 160° C., which was immediately above the solidification temperature of indium. Ultrasonic vibration was applied to the molten indium liquid immediately before solidification by using an apparatus based on the principle that an electrostriction type vibrator vibrates at a high frequency, amplifying the vibration of the vibrator with an amplifier, subsequently transferring the vibration to an ultrasonic vibration horn, and inserting this ultrasonic vibration horn directly into molten indium. While the temperature of the molten metal to which vibration was being applied was measured with a thermocouple for temperature measurement, the ultrasonic vibration horn was pulled out when the temperature decreased to 156° C., and thereby the application of ultrasonic vibration was stopped. Subsequently, the ingot was processed into a disc shape having a diameter of 204 mm and a thickness of 6 mm, and used as a sputtering target for each of Invention Examples and Comparative Examples.

For the indium targets thus obtained, the property values of the following items A to D were measured by the methods described earlier.

For the measurement of the items A to C, a commercially available carbon powder was used for surface polishing, and the measurement was made by visual observation.

For the measurement of the item D, an electron scanning ultrasonic probe system, PA-101, manufactured by Krautkramer Japan Co., Ltd. was used.

The results are presented in Table 1.
A: Overall average grain size
B: Maximum grain size
C: Cross-sectional aspect ratio of a grain
D: Number density of pores having a pore size of 50 μm or greater Furthermore, each of these indium targets of Invention Examples and Comparative Examples was used to deposit a film for 5 min by using #1737 glass manufactured by Corning, Inc. as a substrate without heating the substrate, with an SPF-313H apparatus manufactured by Canon Anelva Corp., while adjusting the ultimate vacuum pressure in the chamber before the initiation of sputtering to $1 \times 10^{-4}$ Pa, flowing argon gas at 5 sccm, and adjusting the pressure at the time of sputtering to 0.5 Pa and the sputtering power to 650 W. The results are presented in Table 2. Table 2 describes the deposition rate and the arcing count during sputtering.

The deposition rate was calculated from the deposition time and the results of measuring the film thickness with a step gauge, and the arcing counts was measured by a method of visual inspection.

TABLE 1

| No. | Ultrasonic vibration | Cooling rate (° C./min) | A (mm) | B (mm) | C | D (pores/cm³) |
|---|---|---|---|---|---|---|
| Comparative Example 1 | Absent | 10 (natural cooling) | 20 | 32 | 0.83 | 0.7 |
| Invention Example 1 | Present | 10 (natural cooling) | 5 | 13 | 0.85 | 0.3 |
| Comparative Example 2 | Absent | 100 (high rate cooling) | 2 | 7 | 0.93 | 2.5 |
| Invention Example 2 | Present | 5 (low rate cooling) | 8 | 18 | 0.75 | 0 |
| Comparative Example 3 | Present | 1 (ultralow rate cooling) | 15 | 26 | 0.69 | 0.1 |
| Invention Example 3 | Present | 70 (high rate cooling) | 2 | 8 | 0.88 | 0.9 |

TABLE 2

| No. | Deposition rate (nm/min) | Arcing counts |
|---|---|---|
| Comparative Example 1 | 350 | 0 |
| Invention Example 1 | 401 | 0 |
| Comparative Example 2 | 410 | 20 |
| Invention Example 2 | 396 | 0 |
| Comparative Example 3 | 369 | 0 |
| Invention Example 3 | 405 | 0 |

The following is understood from Table 1 and Table 2.

Comparative Example 1 is an example of natural cooling without ultrasonic vibration, and the average grain size became excessively large. As a result, the deposition-rate became low.

In Invention Example 1, natural cooling was carried out in the same manner as in Comparative Example 1, but as ultrasonic vibration was applied, the average grain size decreased, and the deposition rate was enhanced.

In Comparative Example 2, the average grain size was made small by high rate cooling, but since ultrasonic vibration was not applied, the amount of pores increased. As a result, the arcing counts increased.

In Invention Example 2, since the cooling rate was made slightly lower than that of Invention Example 1, the average grain size was slightly larger. However, as ultrasonic vibration was applied, the average grain size was smaller than that of Comparative Example 1.

Comparative Example 3 is an example in which, although ultrasonic vibration was applied, since the cooling rate was made too slow, the average grain size became excessively large.

Invention Example 3 is an example in which the deposition rate was increased by increasing the cooling rate. Although the cooling rate was quite high, an increase in the amount of pores was suppressed, and no arcing was observed.

REFERENCE SIGNS LIST

10 Target
11 Central axis
12 Cut surface
x Perpendicular direction
y Parallel direction

The invention claimed is:

1. A sputtering target consisting of indium at a purity of at least 99.99% by mass, wherein:
   the target has cast structure;
   an overall average grain size is 1 to 10 mm;
   for the grains observed from a cross-section parallel to a thickness direction, a ratio of an average grain size in a direction parallel to the thickness direction with respect to an average grain size in a direction perpendicular to the thickness direction is 0.7 to 1.1; and
   pores with a pore size of 50 µm or greater exists at a density of 0 pore/cm³.

2. The sputtering target according to claim 1, wherein the maximum grain size is 20 mm or less.

3. The sputtering target according to claim 1, wherein the maximum grain size is 5 to 20 mm.

4. A method for manufacturing the sputtering target according to claim 1, the method comprising melting and casting an indium raw material, wherein ultrasonic vibration is applied at least at the time of solidification of the indium raw material, and cooling is carried out at a time of melting and casting at a cooling rate of 3° C./min to 8° C./min.

5. A sputtering target consisting of indium at a purity of at least 99.99% by mass, wherein:
   the target has cast structure;
   an overall average grain size is 1 to 3 mm;
   for the grains observed from a cross-section parallel to a thickness direction, a ratio of an average grain size in a direction parallel to the thickness direction with respect to an average grain size in a direction perpendicular to the thickness direction is 0.7 to 1.1; and
   pores with a pore size of 50 µm or greater exists at a density of 1 pore/cm³ or less.

6. The sputtering target according to claim 5, wherein the maximum grain size is 5 to 20 mm.

7. A method for manufacturing the sputtering target according to claim 5, the method comprising melting and casting an indium raw material, wherein ultrasonic vibration is applied at least at the time of solidification of the indium raw material, and cooling is carried out at a time of melting and casting at a cooling rate of 20° C./min or higher.

* * * * *